United States Patent
Quek

(10) Patent No.: US 6,924,180 B2
(45) Date of Patent: Aug. 2, 2005

(54) METHOD OF FORMING A POCKET IMPLANT REGION AFTER FORMATION OF COMPOSITE INSULATOR SPACERS

(75) Inventor: Elgin Quek, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 10/361,934

(22) Filed: Feb. 10, 2003

(65) Prior Publication Data

US 2004/0157397 A1 Aug. 12, 2004

(51) Int. Cl.⁷ .............................................. H01L 21/84
(52) U.S. Cl. ...................... 438/163; 438/174; 438/185; 438/194; 438/217; 438/231; 438/232; 438/303
(58) Field of Search ............................... 438/163, 174, 438/185, 194, 217, 231, 232, 303

(56) References Cited

U.S. PATENT DOCUMENTS

| | | | |
|---|---|---|---|
| 4,636,822 A | * | 1/1987 | Codella et al. ............. 257/282 |
| 5,320,974 A | * | 6/1994 | Hori et al. ................... 438/302 |
| 5,757,045 A | * | 5/1998 | Tsai et al. ................... 257/336 |
| 5,786,620 A | | 7/1998 | Richards, Jr. et al. |
| 6,030,871 A | | 2/2000 | Eitan |
| 6,306,712 B1 | | 10/2001 | Rodder et al. |
| 6,346,468 B1 | | 2/2002 | Pradeep et al. |
| 6,391,732 B1 | | 5/2002 | Gupta et al. |
| 6,492,665 B1 | * | 12/2002 | Akamatsu et al. .......... 257/192 |
| 6,614,079 B2 | * | 9/2003 | Lee et al. ................... 257/382 |
| 2001/0012672 A1 | * | 8/2001 | Dennison et al. ........... 438/306 |
| 2002/0074597 A1 | * | 6/2002 | Ahmad et al. .............. 257/344 |

* cited by examiner

*Primary Examiner*—George Fourson
*Assistant Examiner*—Thanh V. Pham
(74) *Attorney, Agent, or Firm*—George O. Saile; Rosemary L.S. Pike; Stephen B. Ackerman

(57) ABSTRACT

A process for forming a MOSFET device featuring a pocket region placed adjacent to only a top portion of the sides of a heavily doped source/drain region, has been developed. The process features forming a heavily doped source/drain region in an area of a semiconductor substrate not covered by the gate structure or by composite insulator spacers located on the sides of the gate structure. Selective removal of an overlying insulator component of the composite insulator spacer allows a subsequent pocket implant region to be formed in an area of the semiconductor substrate directly underlying a horizontal portion of a remaining L shaped insulator spacer component. The location of the pocket region, formed butting only the top portions of the sides of the heavily doped source/drain region, reduces the risk of punch through current while limiting the impact of junction capacitance.

27 Claims, 3 Drawing Sheets

METHOD OF FORMING A POCKET IMPLANT REGION AFTER FORMATION OF COMPOSITE INSULATOR SPACERS

BACKGROUND OF THE INVENTION (1) Field of the Invention

The present invention relates to methods used to fabricate semiconductor devices, and more specifically to a method of reducing the risk of punch through current for a metal oxide semiconductor field effect transistor (MOSFET), device, via formation of a pocket region formed after composite spacer formation.

(2) Description of Prior Art

The emergence of MOSFET devices featuring sub-0.18 um channel lengths, has led to source/drain engineering procedures such procedures used to form pocket, or halo regions. The narrowing space between a source/drain region, experienced with short channel lengths, can result in unwanted punch through current generated by the close proximity of the source/drain depletion regions. A method used to reduce the risk of punch through has been the formation of pocket, or halo regions, surrounding the source/drain regions. These regions comprised with the same conductivity type as the semiconductor substrate or well region, but featuring a higher dopant level than the semiconductor substrate or well region, reduce the extent of depletion region when compared to depletion regions formed at the junctions of the non-pocket structures, thus resulting in less punch through current. However the increased dopant concentration of the pocket region adversely influences MOSFET performance via the increased junction capacitance. Therefore trade-offs between yield, less punch through current, and performance, increased junction capacitance, arise when implementing pocket or halo regions for short channel MOSFET devices.

This invention will describe a novel process sequence for implementation of a punch through region for a short channel MOSFET device. This invention will feature the formation of a pocket or punch through region at a specific point of the MOSFET fabrication sequence, after composite insulator spacer and heavily doped source/drain formation. This process sequence, also featuring selective removal of a composite insulator spacer component, offers reduced risk of punch through current, with less impact on junction capacitance. Prior art such as Gupta et al, in U.S. Pat. No. 6,391,732 B1, Pradeep et al, in U.S. Pat. No. 6,346,468 B1, Rodder et al, in U.S. Pat. No. 6,306,712 B1, Eiten, in U.S. Pat. No. 6,030,871, and Richards, Jr, et al, in U.S. Pat. No. 5,786,620, describe methods of forming composite insulator spacers, as well as methods of forming implanted pocket regions. However none of the prior art describe the novel process sequence employed in the present invention in which a pocket implant region is formed in a specific region of the MOSFET device, after composite insulator and heavily doped source/drain formation, allowing reduced punch though leakage to be obtained with less impact on performance degrading junction capacitance.

SUMMARY OF THE INVENTION

It is an object of this invention to form a pocket region for a MOSFET device, to reduce punch through current.

It is another object of this invention to limit the formation of the pocket region of the MOSFET device to an area only surrounding specific regions of a heavily doped source/drain region to minimize junction capacitance.

It is still another object of this invention to selectively remove a thick component of the composite insulator spacer after heavily doped source/drain formation, prior to the pocket implant procedure, to limit the formation of the pocket or halo region to specific areas surrounding the heavily doped source/drain region.

In accordance with the present invention a method of forming a pocket region for a MOSFET device, implanted after formation of a heavily doped source/drain region, and after removal of a thick component of a composite insulator spacer, allowing reduced punch through current to be realized with reduced impact on junction capacitance, is described. After definition of a gate structure on an underlying gate insulator layer, a lightly doped source/drain (LDD), region, and a completely surrounding LDD pocket region, are formed in an area of a semiconductor substrate not covered by the gate structure. A composite insulator spacer, comprised of thin, underlying silicon dioxide and silicon nitride components, and a thicker, overlying silicon oxide component, is formed on the sides of the gate structure. A heavily doped source/drain region is next formed in an area of the semiconductor substrate not covered by the gate structure or by the composite insulator layer. After selective removal of the thicker, overlying silicon oxide component of the composite insulator spacer, an ion implantation procedure is performed forming a pocket region underlying the thin, L shaped, silicon nitride component of the composite insulator spacer, with the pocket region butting the sides of only a top portion of the heavily doped source/drain region. An anneal procedure is performed to activate the ions in the LDD, and in the heavily doped source/drain region, as well as to activate the implanted dopants in the pocket regions.

BRIEF DESCRIPTION OF THE DRAWINGS

The object and other advantages of this invention are best described in the preferred embodiment, with reference to the attached drawings that include.

DESCRIPTION OF THE PREFERRED EMBODIMENTS

Figure 1:
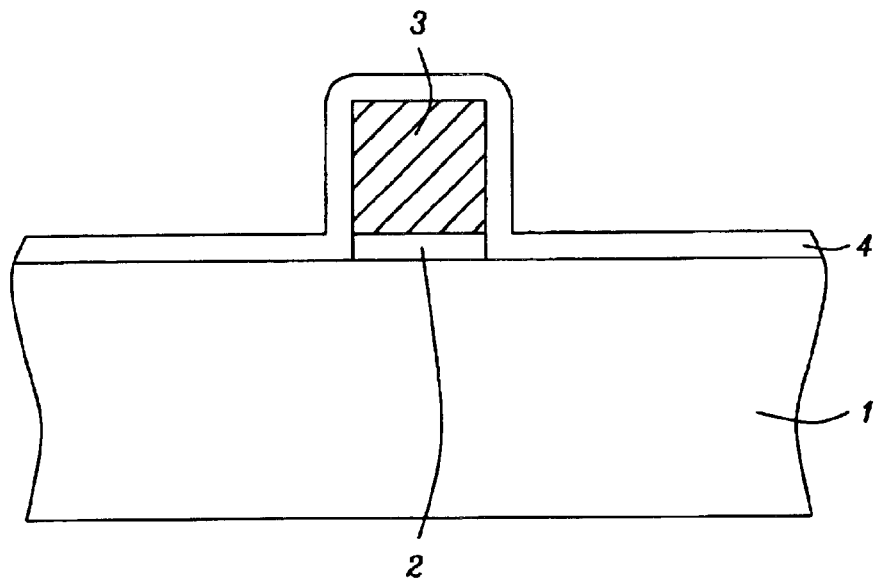
FIGS. 1–6, which schematically in cross-sectional style describe key stages used to fabricate a pocket region, implanted after formation of a heavily doped source/drain region and after removal of a thick component of a composite insulator spacer, allowing the formation of the pocket region to be limited to an area which results in a reduction of punch through current, with a reduced impact on junction capacitance.

The method of forming a pocket region for a MOSFET device, located in an area surrounding only the sides of a top portion of the heavily doped source/drain region, thus offering reduced punch through current while limiting the impact of junction capacitance, will now be described in detail. This invention can be applied to both N channel, (NFET), and P channel (PFET), devices, however in this invention only the NFET example will be described. Semiconductor substrate 1, comprised of single crystalline, P type silicon, featuring a <100> crystallographic orientation, is used and schematically shown in FIG. 1. If desired a P well region, as well as a threshold adjust region (neither region shown in the drawings), can be formed in a top portion of semiconductor substrate 1, for purposes of adjusting the dopant level of semiconductor substrate 1, and therefore adjusting the threshold voltage of a subsequent MOSFET device. Gate insulator layer 2, comprised of silicon dioxide, is next thermally grown to a thickness between about 10 to 20 Angstroms, in an oxygen—steam, or in an oxygen ambient. If desired gate insulator 2, can be comprised of silicon nitride, or of a nitrided oxide layer formed by annealing of a base silicon oxide layer in a NO or $NO_2$ ambient. In addition, if desired, gate insulator layer 2, can be comprised of a high dielectric constant material such as $HFO_2$. A conductive layer, such as a doped polysilicon layer, or a metal silicide layer, is next formed at a thickness between about 1000 to 2500 Angstroms, on gate insulator layer 2. The doped polysilicon option is accomplished via deposition of a polysilicon layer, via low pressure chemical vapor deposition (LPCVD), or plasma enhanced chemical vapor deposition (PECVD), procedures, with the polysilicon layer in situ doped during deposition via the addition of arsine or phosphine to a silane or disilane ambient. The polysilicon layer can also be deposited intrinsically then doped via implantation of arsenic or phosphorous ions. The metal silicide option can be accomplished via deposition of a layer such as tungsten silicide, via chemical vapor deposition (CVD), or physical vapor deposition (PVD), procedures. Photolithographic and anisotropic reactive ion etching (RIE), procedures are next employed to define gate structure 3, in the conductive layer. The RIE procedure, performed using $Cl_2$ or $SF_6$ as a selective etchant for the conductive layer, terminates at the appearance of the top surface of gate insulator layer 2. Removal of the photoresist shape used for definition of gate structure 3, is accomplished via plasma oxygen ashing and wet clean procedures, with a buffered hydrofluoric acid component of the wet clean procedure removing the portions of gate insulator layer 2, not covered by gate structure 3. Gate structure 3, is defined with a width between about 0.03 to 0.50 um. A thermal oxidation procedure is next used to grow silicon dioxide layer 4, on the exposed surfaces of gate structure 3, as well as on the exposed portion of top surface of semiconductor substrate 1. Silicon dioxide layer 4, is grown to a thickness between about 10 to 30 Angstroms. The result of these procedures is schematically shown in FIG. 1.

Figure 2:
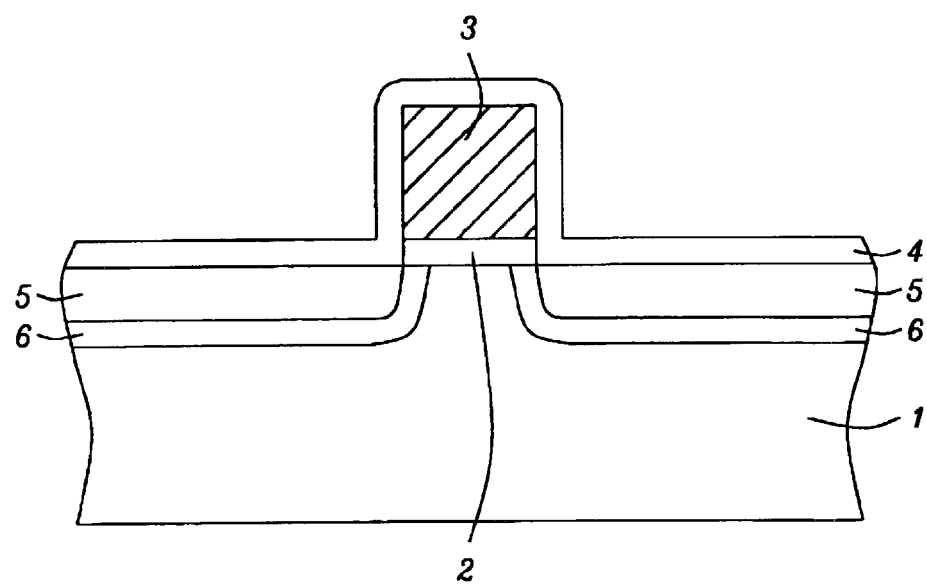

Formation of source/drain extension (SPE), or N type lightly doped source/drain (LDD), regions, and the enveloping pocket implant regions, is next addressed and schematically shown in FIG. 2. If the NFET device now being fabricated is a component of a complimentary metal oxide semiconductor (CMOS), device, the PFET component of the CMOS device is protected by a defined photoresist shape during the NFET LDD and pocket implantation procedures. A first implantation procedure is performed placing arsenic or phosphorous ions in an area of semiconductor substrate 1, not covered by gate structure 3, forming N type LDD region 5. This is accomplished at an implant energy between about 1 to 10 KeV, for As ions, and at an implant dose between about 3E13 to 3E15 atoms/$cm^2$. To prevent encroachment of the SPE depletion regions, which can alter or reduce the designed channel length underlying gate structure 3, a shallow pocket implant region, featuring the same conductivity type as semiconductor substrate 1, but featuring a higher dopant level than semiconductor substrate 1, is formed to completely envelope N type LDD region 5. This is accomplished via ion implantation procedures performed in situ, either before, or after implantation of N type LDD region 5. P type, pocket region 6, is obtained via implantation of boron or $BF_2$ ions, at an energy between about 7 to 15 KeV, for boron ions, at a dose between about 2E13 to 7E13 atoms/$cm^2$.

Figure 3:
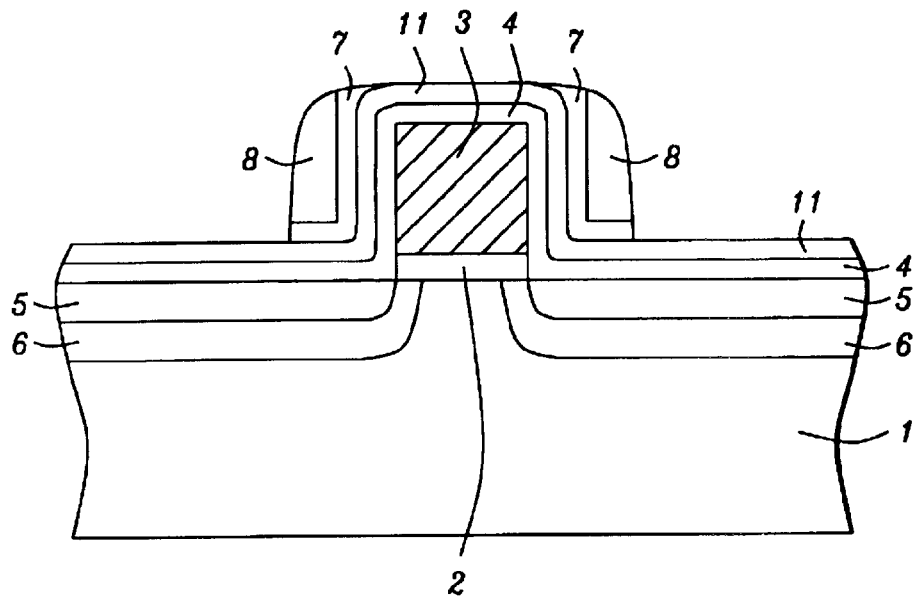

A composite insulator spacer, shown schematically in FIG. 3, is next formed on the sides of gate structure 3. First silicon oxide layer 11, is deposited at a thickness between about 80 to 150 Angstroms, via LPCVD or PECVD procedures, using tetraethylorthosilicate (TEOS), as a source. Next silicon nitride layer 7, is deposited at a thickness between about 150 to 300 Angstroms, via LPCVD or PECVD procedures. Silicon oxide layer 8, is then deposited to a thickness between about 400 to 700 Angstroms, again using LPCVD or PECVD procedure, again employing TEOS as a source. A first phase of an anisotropic RIE procedure is next performed selectively defining silicon oxide spacer component 8, with the selective RIE procedure, using $CHF_3$ as an etchant for silicon oxide, terminating at the appearance of silicon nitride. The second phase of the anisotropic RIE procedure is now performed using $Cl_2$ as a selective etchant for silicon nitride, resulting in the definition of silicon nitride spacer component 7, located on the sides of gate structure 3, underlying silicon oxide spacer component 8. The second phase of the anisotropic RIE procedure selectively terminates at the appearance of silicon dioxide layer 11, resulting in the composite insulator spacer formed on the sides of gate structure 3, comprised of overlying silicon oxide spacer component 8, and underlying L shaped, silicon nitride spacer component 7.

Figure 4:
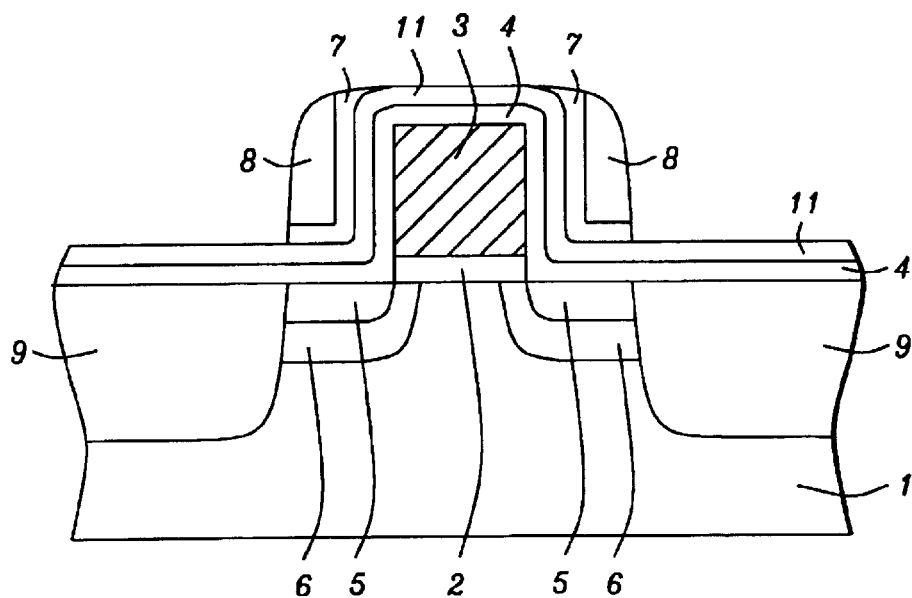

Heavily doped N type source/drain region 9, is next formed in areas of semiconductor substrate 1, not covered by gate structure 3, or by the composite insulator spacers. Again if the NFET device described in this invention is a component of a CMOS device, a photoresist shape would be used to protect the PFET device from the procedure used to form the heavily doped N type source/drain region for the NFET device. Heavily doped N type source/drain region 9, schematically shown in FIG. 4, is formed via implantation of arsenic or phosphorous ions, at an energy between about 35 to 75 KeV, at a dose between about 2E15 to 7E15 atoms/$cm^2$. To reduce junction capacitance a second N type source/drain ion implantation procedure is performed employing phosphorous ions implanted at an energy between about 25 to 45 KeV, at a dose between about 1E13 to 4E13 atoms/$cm^2$. A tilt angle between about 0 to 7 degrees is used for the phosphorous implantation procedure to grade the $N^+/P$ well dopant profile.

Figure 5:
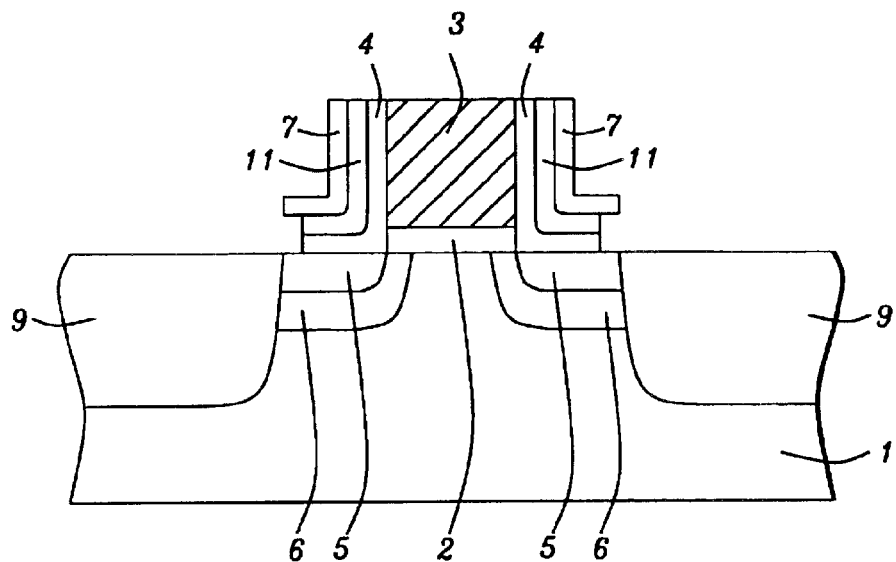

To reduce the level of punch through current generated by the depletion regions formed at the interface of heavily doped N type source/drain 9, and semiconductor substrate 1, a deep P type pocket region, higher in P type dopant concentration than the P type dopant level in semiconductor substrate 1, is formed. However to reduce the impact of increased junction capacitance resulting from the higher dopant concentration in the deep P type pocket region in semiconductor substrate 1, the formation of the P type pocket region will be restricted to only a region surrounding a top portion of the sides of heavily doped N type source/drain region 9. To accomplish this a selective wet etch procedure performed using buffered hydrofluoric acid as an etchant, is employed to remove silicon oxide spacer component 8, as well as to remove exposed portions of silicon dioxide layer 11, and of silicon oxide layer 4. The selectivity of the buffered hydrofluoric acid solution allows the procedure to terminate at the appearance of L shape, silicon nitride spacer component 7. This is schematically shown in FIG. 5. Again if the NFET device being described in this present invention is a component of a CMOS device, the photoresist shape in place to mask the PFET component of the CMOS device, would protect the PFET device from the selective, buffered hydrofluoric acid procedure.

Figure 6:
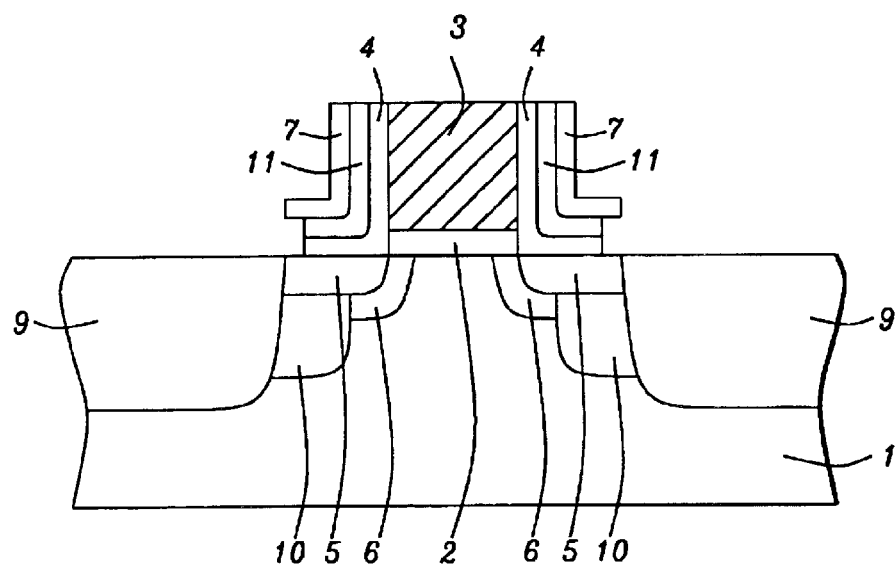

Deep P type pocket implant region 10, is now formed in an area of semiconductor substrate 1, not covered by gate structure 3, and not occupied by heavily doped N type source/drain region 9. This is accomplished via implantation of boron or $BF_2$ ions, at an energy between about 21 to 31 KeV for boron ions, at a dose between about 3E13 to 8E13 atoms/$cm^2$, employing an implant tilt angle between about 10 to 30 degrees. The implant energy chosen allows the P type ions to penetrate the horizontal portion of L shaped silicon nitride spacer component 7, as well as the portions of the underlying silicon dioxide layers 11, and 4. In addition the implant dose is great enough to form deep P type pocket implant region 10, in exposed portions of the lighter doped, shallow P type pocket region 6. However the implant dose used for creation of deep P type pocket implant region 10, is not great enough to completely compensate heavily doped N type source/drain region 9, thus resulting in P type pocket implant region 10, located surrounding the only the sides of heavily doped N type source/drain region 9. Portions of N type LDD region 5, still enveloped by shallow P type pocket implant region 6, located underlying the vertical component of the L shaped silicon nitride spacer component, remain uncompensated and therefore still directly influence the channel length dimension of the NFET device. The result of this procedure is schematically shown in FIG. 6. A photoresist shape, used to protect a PFET device, if used as a component of a CMOS device, would now be removed via plasma oxygen ashing and wet clean procedures. An anneal procedure, performed via rapid thermal annealing, is next applied at a temperature between about 1050 to 1090° C., for a time between about 0 to 15 sec, in an inert ambient, to activate all implanted ions.

If a deep pocket region is to be used for a PFET device, after formation of an N well region in a P type sericonductor substrate, a P type LDD region, and an enveloping, shallow, N type pocket region would first be formed. After formation of the composite insulator spacers on the sides of the gate structure, a heavily doped P type source/drain region is formed, followed by removal of the overlying insulator component of the composite insulator spacer. A subsequent N type implantation procedure results in formation of a deep N type pocket region, located surrounding the sides of only top portions of the heavily doped P type source/drain region, with the N type dopant level of the deep N type pocket region greater than the N type dopant level of the N well region.

While this invention has been particularly shown and described with reference to, the preferred embodiments thereof, it will be understood by those skilled in the art that various changes in form and details may be made without departing from the spirit and scope of this invention:

What is claimed is:

1. A method of forming a metal oxide semiconductor field effect transistor (MOSFET), on a semiconductor substrate, featuring formation of a combination of two pocket implant regions, one completely surrounding a lightly doped source/drain region and the other formed adjacent to the sides of a heavily doped source/drain region, comprising the steps of:

providing a gate insulator layer on a semiconductor substrate comprised with a first conductivity type, with a gate structure overlying said gate insulator layer;

forming a said lightly doped source/drain (LDD) region of a second conductivity type, in portion of said semiconductor substrate not covered by said gate structure;

forming first pocket region of a first conductivity type in a portion of said semiconductor substrate not covered by said gate structure, with said first pocket region completely surrounding said LDD region, and wherein said first pocket region, completely enclosing said LDD region, is comprised with a dopant level greater than the dopant level of said semiconductor substrate;

forming a composite insulator spacer on sides of said gate structure, with said composite insulator spacer comprised of an underlying L shaped insulator component, and comprised of an overlying insulator component;

forming said heavily doped source/drain region of a second conductivity type, in a portion of said semiconductor substrate not covered by said gate structure or by said composite insulator spacer;

removing said overlying insulator component of said composite insulator spacer; and forming a second pocket region of a first conductivity type in a portion of said semiconductor substrate underlying horizontal portion of L shaped insulator component and adjacent to sides of said heavily doped source/drain region, with said second pocket region comprised with a dopant level greater than the dopant level of said first pocket region.

2. The method of claim 1, wherein said semiconductor substrate is a P type semiconductor substrate.

3. The method of claim 1, wherein said gate insulator layer is a silicon dioxide gate insulator, obtained via thermal oxidation procedures to a thickness between about 10 to 20 Angstroms.

4. The method of claim 1, wherein said gate structure is comprised of doped polysilicon or metal silicide.

5. The method of claim 1, wherein the width of said gate structure is between about 0.03 to 0.50 um.

6. The method of claim 1, wherein said lightly doped source/drain region is an N type, lightly doped source/drain region, obtained via implantation of arsenic or phosphorous ions, at an implant energy between about 1 to 10 KeV, and at an implant dose between about 3E15 to 5E15 atoms/cm$^2$.

7. The method of claim 1, wherein said first pocket region is a P type pocket region, obtained via implantation of boron or $BF_2$ ions, at an implant energy between about 7 to 15 KeV, and at an implant dose between about 2E13 to 7E13 atoms/cm$^2$.

8. The method of claim 1, wherein said underlying L shaped insulator component of said composite insulator spacer is comprised of silicon nitride, at a thickness between about 150 to 300 Angstroms.

9. The method of claim 1, wherein said composite insulator spacer is defined via an anisotropic RIE procedure applied to an overlying silicon oxide layer using $CHF_3$ as an etchant, and applied to an underlying silicon nitride layer using $Cl_2$ as an etchant.

10. The method of claim 1, wherein said overlying insulator component of said composite insulator spacer is comprised of silicon oxide, at a thickness between about 400 to 700 Angstroms.

11. The method of claim 1, wherein silicon oxide of said overlying insulator component of said composite insulator spacer, is obtained via LPCVD or PECVD procedures, using tetraethylorthosilicate (TEOS), as a source.

12. The method of claim 1, wherein said heavily doped source/drain region is a heavily doped N type source/drain region, obtained via implantation of arsenic or phosphorous ions, at an implant energy between about 35 to 75 KeV, and at an implant dose between about 2E15 to 7E15 atoms/cm$^2$, followed by an additional procedure performed via implantation of phosphorous ions at an energy between about 25 to 45 KeV, at a dose between about 1E13 to 4E13, using an implant angle between about 0 to 7°.

13. The method of claim 1, wherein said overlying insulator component is removed via a selective wet etch procedure, using a buffered hydrofluoric acid solution.

14. The method of claim 1, wherein said second pocket region is a P type pocket region, obtained via implantation of boron or $BF_2$ ions, at an implant energy between about 21 to 31 KeV, and at an implant dose between about 3E13 to 8E13 atoms/cm$^2$, using an implant or tilt angle between about 10 to 30°.

15. A method of forming a metal oxide semiconductor field effect transistor (MOSFET), on a semiconductor substrate, featuring formation of a combination of pocket implant regions, with a second pocket region comprised of a deep P type pocket region formed after heavily doped source/drain and composite insulator spacer formation, comprising the steps of:

forming silicon dioxide gate insulator layer on a P type semiconductor substrate;

forming conductive gate structure on said silicon dioxide gate insulator layer;

forming N type, lightly doped source/drain (LDD) region in a portion of said P type semiconductor substrate not covered by said conductive gate structure;

forming a first pocket region, a shallow, P type pocket region formed in an area of said P type semiconductor substrate not covered by said conductive gate structure, with said shallow, P type pocket region completely surrounding and enclosing said N type LDD region, and wherein said shallow, P type pocket region is comprised with a P type dopant level greater than the P type dopant level of said P type semiconductor substrate;

forming a silicon nitride layer;

forming a silicon oxide layer;

performing an anisotropic reactive ion etch procedure to form a composite insulator spacer on sides of said conductive gate structure, with said composite insulator spacer comprised of an underlying L shaped silicon nitride component, and comprised of an overlying silicon oxide component;

forming a heavily doped N type source/drain region in an area of said P type semiconductor substrate not covered by said conductive gate structure or by said composite insulator spacer;

removing said overlying silicon oxide component of said composite insulator spacer;

forming said second pocket region, said deep, P type pocket region, formed using an implantation angle between about 10 to 30° in a portion of said P type semicondutor substrate underlying a horizontal portion of said L shaped silicon nitride insulator component of said composite insulator spacer, with said deep, P type pocket region comprised with a P type dopant level greater than the P type dopant level of said shallow pocket region; and performing an anneal procedure.

16. The method of claim 15, wherein said silicon dioxide gate insulator layer is obtained at thickness between about 10 to 20 Angstroms, via a thermal oxidation procedure performed in an oxygen—steam ambient.

17. The method of claim 15, wherein said conductive gate structure is comprised of doped polysilicon, or metal silicide.

18. The method of claim 15, wherein said conductive gate structure is comprised with a width between about 0.03 to 0.50 um.

19. The method of claim 15, wherein said N type lightly doped source/drain region is obtained via implantation of arsenic or phosphorous ions, at an implant energy between about 1 to 10 KeV, and at an implant dose between about 3E13 to3E15 atoms/cm$^2$.

20. The method of claim 15, wherein said shallow, P type pocket region is obtained via implantation of boron or $BF_2$ ions, at an implant energy between about 7 to 15 KeV, and at an implant dose between about 2E13 to 7E13 atoms/cm$^2$.

21. The method of claim 15, wherein said silicon nitride layer is obtained via LPCVD or PECVD procedures, at a thickness between about 150 to 300 Angstroms.

22. The method of claim 15, wherein said silicon oxide layer is obtained via LPCVD or PECVD procedures, at a thickness between about 400 to 700 Angstroms, using tetraethylorthosilicate (TEOS), as a source.

23. The method of claim 15, wherein said anisotropic reactive ion etch procedure used to define said composite insulator spacer, is performed using $CHF_3$ as an etchant for said silicon oxide layer, and using $Cl_2$ as an etchant for said silicon nitride layer.

24. The method of claim 15, wherein said heavily doped N type source/drain region is obtained via implantation of arsenic or phosphorous ions, at an implant energy between about 35 to 75 KeV, and at an implant dose between about 2E15 to 7E15 atoms/cm$^2$, followed by an additional procedure performed via implantation of phosphorous ions at an energy between about 25 to 45 KeV, at a dose between about 1E13 to 4E13, using an implant angle between about 0 to 7°.

25. The method of claim 15, wherein said overlying silicon oxide component of said composite insulator spacer, is removed via a selective wet etch procedure using a buffered hydrofluoric acid solution.

26. The method of claim 15, wherein said deep, P type pocket region is obtained via implantation of boron or $BF_2$ ions, at an implant energy between about 21 to 31 KeV, and at an implant dose between about 3E13 to 8E13 atoms/cm$^2$, using an implant or tilt angle between about 10 to 30°.

27. The method of claim 15, wherein said anneal procedure is a rapid thermal anneal RTA), procedure, performed at a temperature between about 1050 to 1090° C., for a time between about 0 to 15 sec, in an inert ambient.

* * * * *